United States Patent
Sakai et al.

(10) Patent No.: US 9,479,049 B2
(45) Date of Patent: Oct. 25, 2016

(54) SEMICONDUCTOR MODULE AND BOOST RECTIFIER CIRCUIT

(71) Applicant: MITSUBISHI ELECTRIC CORPORATION, Tokyo (JP)

(72) Inventors: Shinji Sakai, Tokyo (JP); Masahiro Kato, Tokyo (JP); Tomofumi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 76 days.

(21) Appl. No.: 14/145,324

(22) Filed: Dec. 31, 2013

(65) Prior Publication Data

US 2014/0247030 A1    Sep. 4, 2014

(30) Foreign Application Priority Data

Mar. 4, 2013  (JP) .................................. 2013-041643

(51) Int. Cl.
| | |
|---|---|
| *H02M 3/156* | (2006.01) |
| *H02M 3/04* | (2006.01) |
| *H02M 1/08* | (2006.01) |
| *H02M 1/42* | (2007.01) |

(52) U.S. Cl.
CPC ............... *H02M 3/04* (2013.01); *H02M 1/08* (2013.01); *H02M 1/4225* (2013.01); *H01L 2924/181* (2013.01); *H03K 2217/0081* (2013.01); *Y02B 70/126* (2013.01)

(58) Field of Classification Search
CPC .................... H02M 2001/0045; H02M 3/155; H02M 3/156; H02M 3/158; H02M 2001/0006

USPC .................... 323/222, 223, 224, 268, 282
See application file for complete search history.

(56) References Cited

U.S. PATENT DOCUMENTS

| | | | | |
|---|---|---|---|---|
| 5,216,353 | A | * | 6/1993 | Mori .............................. 323/266 |
| 5,258,701 | A | * | 11/1993 | Pizzi et al. .................... 323/269 |
| 6,456,509 | B1 | | 9/2002 | Yasumura |
| 6,617,832 | B1 | * | 9/2003 | Kobayashi .................... 323/266 |
| 7,019,501 | B2 | | 3/2006 | Dogome et al. |
| 7,560,915 | B2 | * | 7/2009 | Ito et al. ........................ 323/266 |
| 7,872,454 | B2 | | 1/2011 | Sutargja |

(Continued)

FOREIGN PATENT DOCUMENTS

| | | |
|---|---|---|
| CN | 102437718 A | 5/2012 |
| JP | H05-060188 U | 8/1993 |

(Continued)

OTHER PUBLICATIONS

An Office Action issued by the Korean Patent Office on Aug. 25, 2015, which corresponds to Korean Patent Application No. 10-2014-0019395 and is related to U.S. Appl. No. 14/145,324; with English language partial translation.

(Continued)

*Primary Examiner* — Gary L Laxton
(74) *Attorney, Agent, or Firm* — Studebaker & Brackett PC

(57) ABSTRACT

A semiconductor module includes a voltage generator, and a heat dissipating mechanism composed of, for example, an insulating heat dissipating sheet and a heat sink. The voltage generator is capable of generating, by using a built-in linear regulator function, a power source voltage to drive a boost converter based on a voltage boosted by the boost converter. The voltage generator is mounted on the heat dissipating mechanism.

5 Claims, 7 Drawing Sheets

(56) References Cited

U.S. PATENT DOCUMENTS

| | | | |
|---|---|---|---|
| 8,299,763 B2 | 10/2012 | Sutardja | |
| 8,686,761 B2 | 4/2014 | Ozawa | |
| 8,704,503 B2* | 4/2014 | Williams | H02M 1/32 323/222 |
| 8,836,299 B2* | 9/2014 | Tai | H02M 3/1588 323/222 |
| 2002/0044469 A1 | 4/2002 | Yasumura | |
| 2005/0040800 A1 | 2/2005 | Sutardja | |
| 2005/0258891 A1 | 11/2005 | Ito et al. | |
| 2007/0063678 A1 | 3/2007 | Yoshikawa | |
| 2008/0122417 A1 | 5/2008 | Ng et al. | |
| 2009/0167368 A1* | 7/2009 | Chan et al. | 327/108 |
| 2010/0277141 A1 | 11/2010 | Sutardja | |
| 2011/0080118 A1* | 4/2011 | Daniel | 315/297 |
| 2011/0228564 A1 | 9/2011 | Uruno et al. | |
| 2012/0075890 A1 | 3/2012 | Ozawa | |
| 2013/0002224 A1 | 1/2013 | Lin | |

FOREIGN PATENT DOCUMENTS

| | | |
|---|---|---|
| JP | 2002-064980 A | 2/2002 |
| JP | 2005-168277 A | 6/2005 |
| JP | 2006-053803 A | 2/2006 |
| JP | 2010-088272 A | 4/2010 |
| JP | 2011-193705 A | 9/2011 |
| JP | 2012-074829 A | 4/2012 |
| KR | 10-2006-0047875 A | 5/2006 |
| KR | 2012-0098029 A | 9/2012 |

OTHER PUBLICATIONS

An Office Action issued by the Korean Patent Office on Feb. 17, 2016, which corresponds to Korean Patent Application No. 10-2014-0019395 and is related to U.S. Appl. No. 14/145,324; with English language partial translation.

The First Office Action issued by the Patent Office of the People's Republic of China on Dec. 15, 2015, which corresponds to Chinese Patent Application No. 201410077138.1 and is related to U.S. Appl. No. 14/145,324; with English language partial translation.

An Office Action; Notice of Reason for Rejection, issued by the Japanese Patent Office on Jun. 14, 2016, which corresponds to Japanese Patent Application No. 2013-041643 and is related to U.S. Appl. No. 14/145,324; with English language partial translation.

The Second Office Action issued by the Patent Office of the People's Republic of China on Jul. 22, 2016, which corresponds to Chinese Patent Application No. 201410077138.1 and is related to U.S. Appl. No. 14/145,324; with English language partial translation.

An Office Action issued by the Korean Patent Office on Aug. 24, 2016, which corresponds to Korean Patent Application No. 10-2014-0019395 and is related to U.S. Appl. No. 14/145,324; with English language partial translation.

* cited by examiner

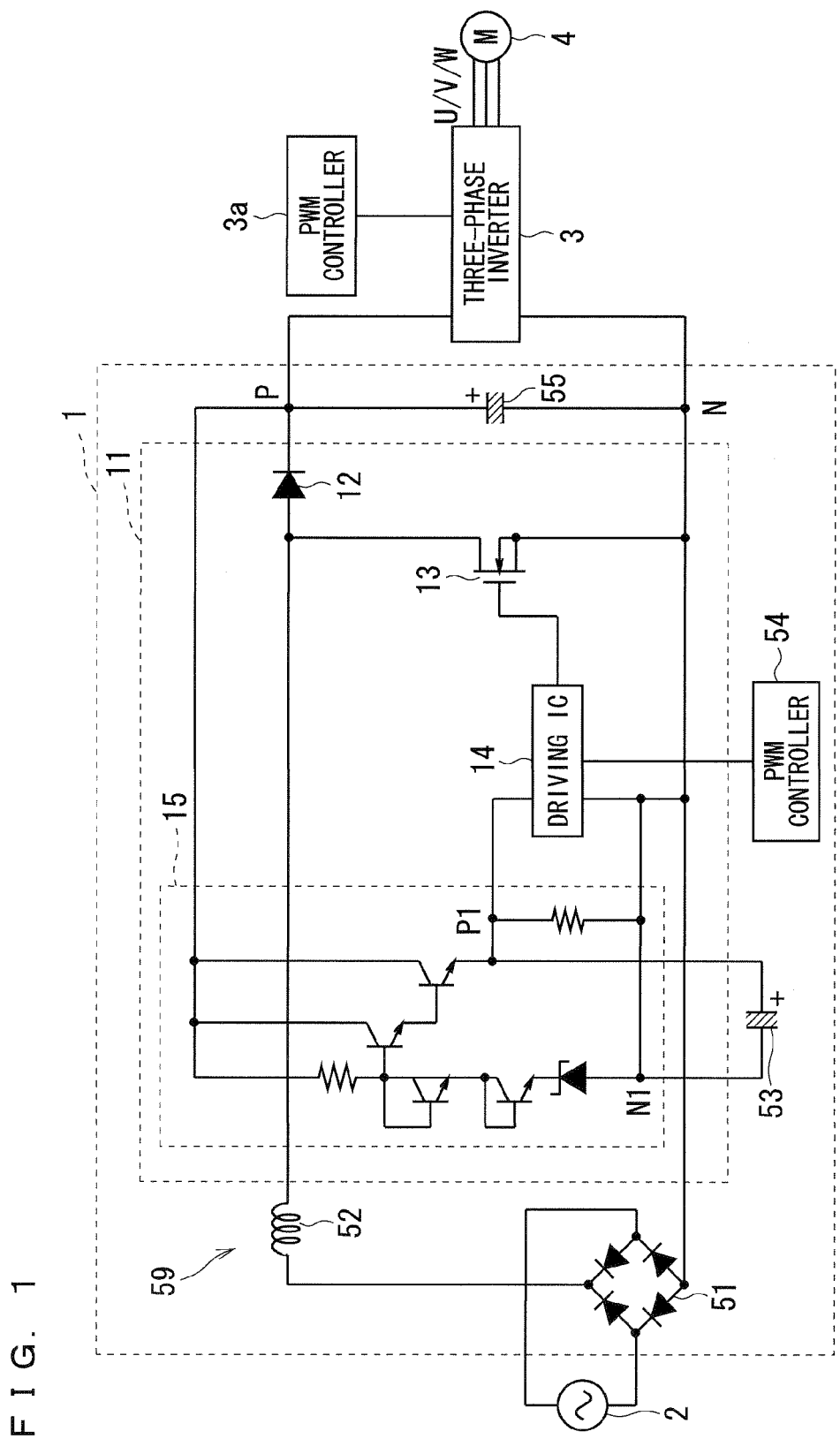
F I G. 1

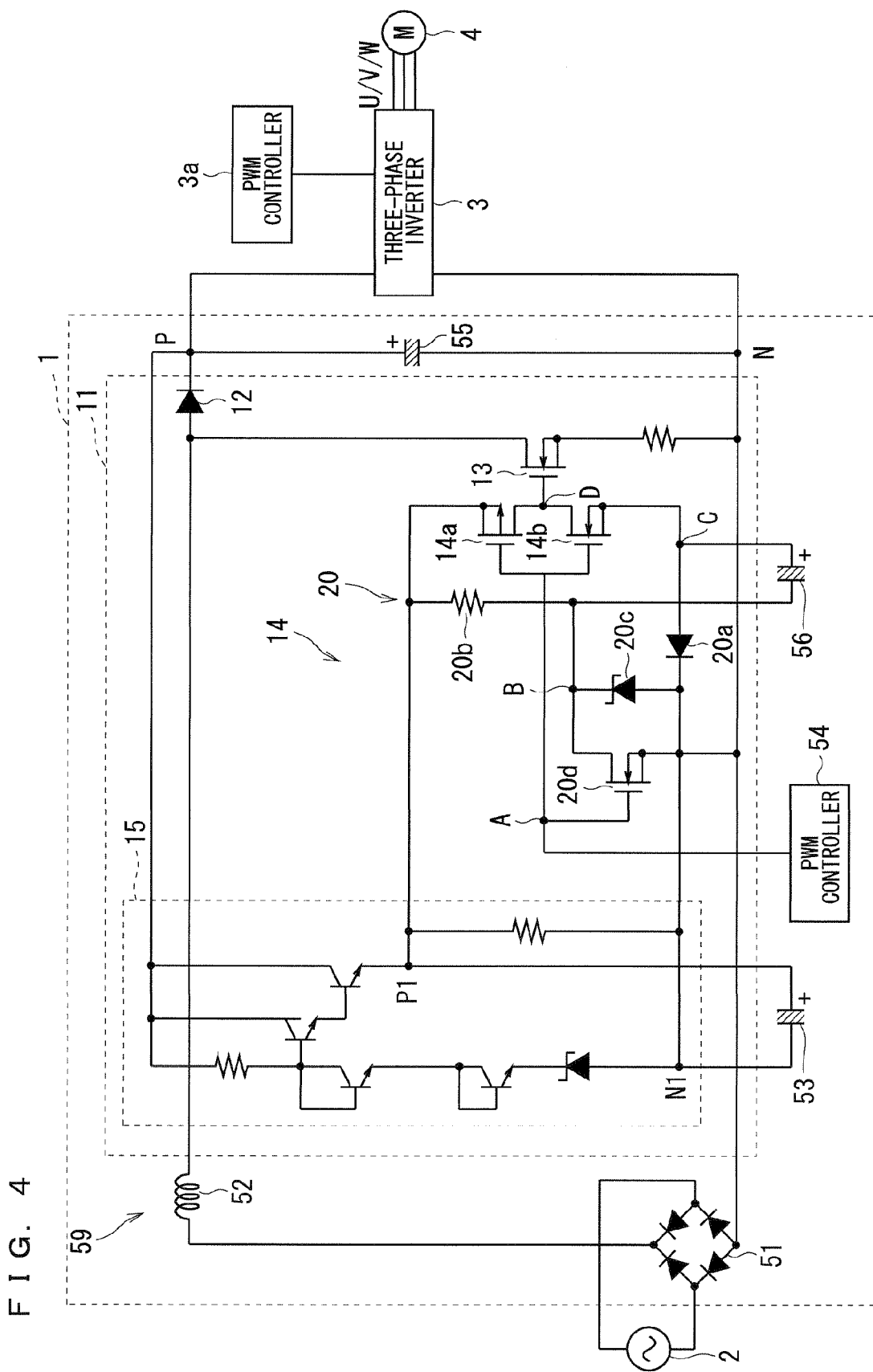
F I G. 4

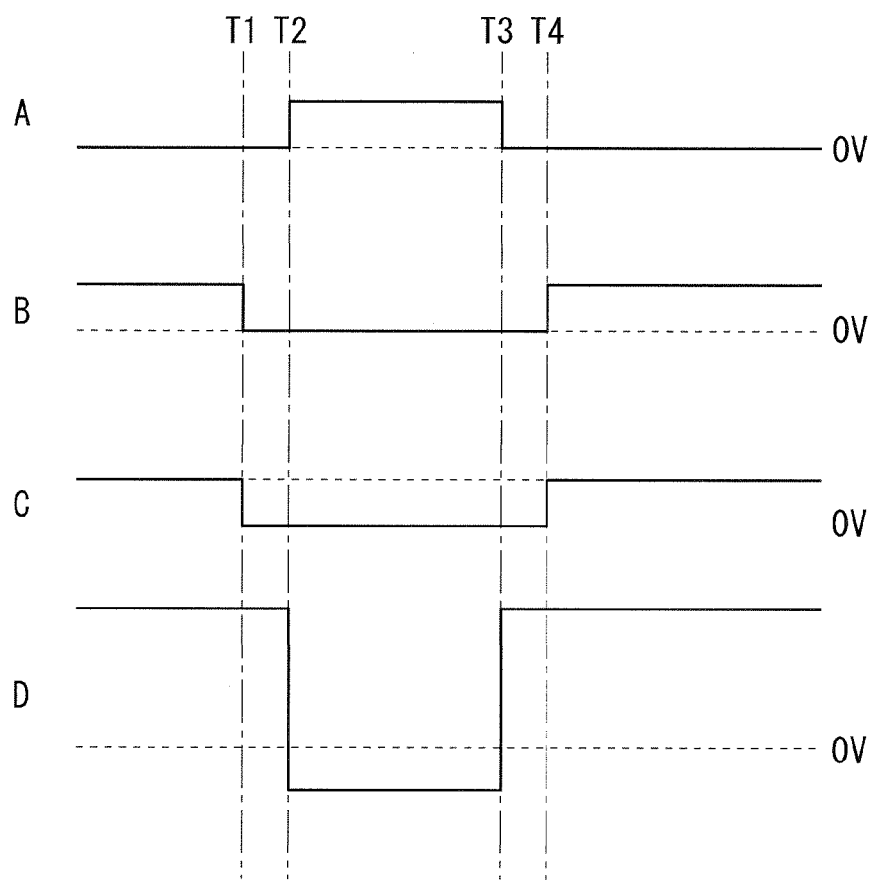
F I G. 7

SEMICONDUCTOR MODULE AND BOOST RECTIFIER CIRCUIT

FIELD OF THE INVENTION

The present invention relates to a semiconductor module capable of generating a power source voltage to drive a boost converter, and a boost rectifier circuit including this semiconductor module.

BACKGROUND ART

A boost converter, conventionally known as one of power semiconductor devices, boosts an input voltage to a desired voltage by using a semiconductor switching element such as an MOSFET (metal oxide semiconductor field effect transistor) and a driving IC (integrated circuit) that drives the semiconductor switching element. Generally, an AC voltage such as that supplied from a household AC power source or applied across an auxiliary winding is converted by a rectifier smoothing circuit composed of a diode, a capacitor and the like to a DC voltage, and the DC voltage is supplied to the boost converter as a power source voltage to drive the boost converter, as described for example in Japanese Patent Application Laid-Open Nos. 2012-74829 and 2006-53803, for example.

The power source voltage being obtained by rectifying the AC voltage and being supplied to the boost converter suffers from a problem such as its instability. Hence, in order to stabilize the power source voltage to drive the boost converter, an IC chip may be given a built-in linear regulator function capable of outputting a fixed voltage. However, a linear regulator circuit generally releases heat generated by a difference between an input voltage input to the linear regulator circuit and an output voltage output from the linear regulator circuit. Thus, a larger amount of heat is released in response to the increase of this difference.

This has made it difficult to provide an IC chip with a built-in linear regulator function that generates a power source voltage of about 15 V to drive the boost converter from a relatively high input voltage of about 100 V or more obtained by rectifying a commercial AC power source for example, in light of a problem such as temperature increase caused by heat generation by the linear regulator function.

SUMMARY OF THE INVENTION

The present invention has been made in light of the aforementioned problems. It is an object of the present invention to provide a technique capable of suppressing temperature increase caused by a linear regulator function.

The present invention is directed to a semiconductor module including a voltage generator and a heat dissipating mechanism. The voltage generator is capable of generating, by using a built-in linear regulator function, a power source voltage to drive a boost converter based on a voltage boosted by the boost converter. The voltage generator is mounted on the heat dissipating mechanism.

The voltage generator having the built-in linear regulator function is mounted on the heat dissipating mechanism, so that temperature increase caused by the linear regulator function can be suppressed. Further, the power source voltage to drive the boost converter is generated by using the linear regulator function based on the voltage boosted by the boost converter, thereby achieving reduction of power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 2 are circuit diagrams each showing the structure of a semiconductor module and that of a boost rectifier circuit according to a first preferred embodiment;

FIG. 4 is a circuit diagram showing the structure of a semiconductor module and that of a boost rectifier circuit according to a second preferred embodiment;

FIG. 7 is a timing chart showing the operation of the semiconductor module and that of the boost rectifier circuit of the third preferred embodiment.

DESCRIPTION OF THE PREFERRED EMBODIMENTS

First Preferred Embodiment

Figure 2:
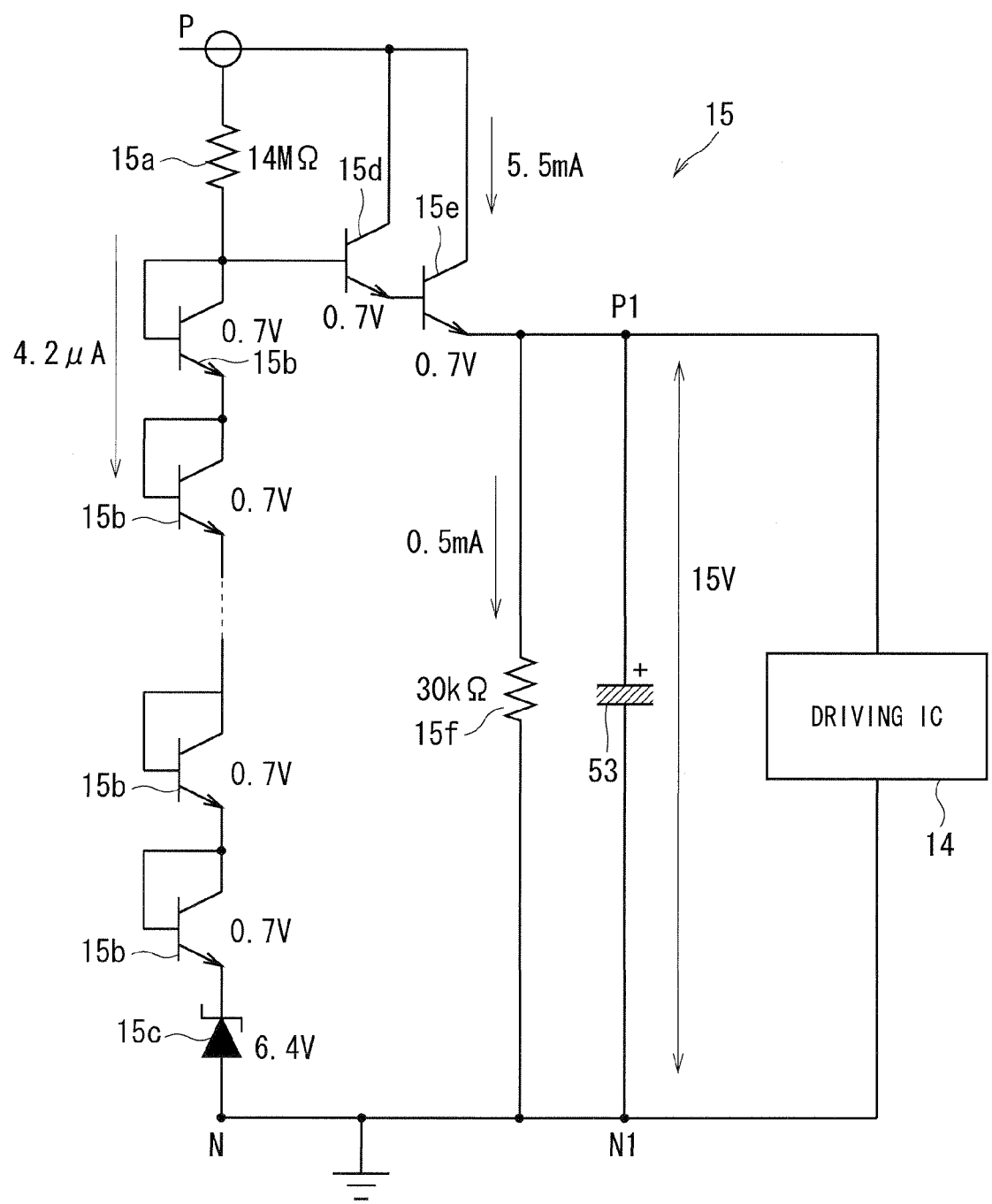

FIG. 1 is a circuit diagram showing the structure of a semiconductor module and that of a boost rectifier circuit including this semiconductor module, according to a first preferred embodiment of the present invention.

As described in detail later, a boost rectifier circuit 1 is capable of realizing a rectifying function of converting an AC voltage input from a commercial AC power source 2 to a DC voltage, and a boosting function of boosting this DC voltage. A three-phase inverter 3 converts the DC voltage boosted in the boost rectifier circuit 1 to an AC voltage and outputs the resultant AC voltage to a motor 4 under control of a PWM (pulse width modulation) controller 3a, thereby driving the motor 4.

The structure of the boost rectifier circuit 1 responsible for the aforementioned operation is described next. As shown in FIG. 1, the boost rectifier circuit 1 includes a semiconductor module 11, a diode bridge (rectifier circuit) 51, an inductor 52, a capacitor 53, a PWM controller 54, and a capacitor 55. While the capacitors 53 and 55 are described as being provided in the boost rectifier circuit 1, they may also be provided externally to the boost rectifier circuit 1.

The semiconductor module 11 is electrically connected to the diode bridge 51, the inductor 52, the capacitor 53, the PWM controller 54, and the capacitor 55. As shown in FIG. 1, the semiconductor module 11 includes a diode 12, a semiconductor switching element 13, a driving IC (driver) 14, and a voltage generator 15.

The diode 12 has a cathode connected at a point P to one end of the capacitor 55, and an anode connected to one end of the inductor 52.

The semiconductor switching element 13 has a source terminal connected at a point N to the opposite end of the capacitor 55, a drain terminal connected to the anode of the diode 12, and a gate terminal connected to the driving IC 14. In the first preferred embodiment, an MOSFET made of a wide band-gap semiconductor such as SiC or GaN is employed as the semiconductor switching element 13, thereby realizing higher breakdown voltage, size reduction, and higher switching speed.

The driving IC 14 transmits a voltage supplied to the driving IC 14 (here, power source voltage supplied from the voltage generator 15) to the gate terminal of the semiconductor switching element 13 in response to a PWM signal (predetermined signal) input from the PWM controller 54. If the driving IC 14 transmits (supplies) the voltage from the voltage generator 15 to the gate terminal of the semiconductor switching element 13 in response to the PWM signal, the semiconductor switching element 13 is ON. If the driving IC 14 does not transmit (supply) the voltage from the voltage generator 15 to the gate terminal of the semiconductor switching element 13 in response to the PWM signal, the semiconductor switching element 13 is OFF. To be specific, the driving IC 14 is configured so as to drive the semiconductor switching element 13 in response to the PWM signal.

The rectifying and boosting functions of the boost rectifier circuit 1 are described next before description of the voltage generator 15.

<Rectifying Function>

The diode bridge 51 is connected to the semiconductor module 11 (here, the source terminal of the semiconductor switching element 13) and the inductor 52. The diode bridge 51 outputs a waveform with positive polarity as it is of an AC voltage input from the commercial AC power source 2, and converts a waveform with negative polarity of this AC voltage to a waveform with positive polarity and outputs the resultant waveform, thereby converting the AC voltage to a DC voltage.

<Boosting Function>

The boost rectifier circuit 1 includes a boost converter 59 that boosts the DC voltage converted by the diode bridge 51. The boost converter 59 includes the diode 12, the semiconductor switching element 13, the inductor 52, and the capacitor 55.

More specifically, in response to switching of the semiconductor switching element 13 from OFF to ON, a DC current resulting from the DC voltage from the diode bridge 51 flows into the inductor 52 to accumulate energy in the inductor 52. In response to switching of the semiconductor switching element 13 from ON to OFF, a DC voltage responsive to the energy accumulated in the inductor 52 is stored in the capacitor 55 via the diode 12. If the semiconductor switching element 13 is switched from OFF to ON again thereafter, the rectifying function of the diode 12 suppresses discharge of the capacitor 55.

As a result, a DC voltage across the terminals of the capacitor 55 (across the points P and N) is increased each time the semiconductor switching element 13 is switched between ON and OFF. This voltage increase can be controlled based on a duty ratio between ON and OFF of the semiconductor switching element 13, specifically, a duty ratio of the PWM signal. This allows the boost converter 59 to boost the DC voltage converted by the diode bridge 51 to a desired voltage based on the duty ratio of the PWM signal.

<Voltage Generator>

The voltage generator 15 is described next. The voltage generator 15 is capable of generating, by using a built-in linear regulator function, a power source voltage to drive the boost converter 59 (voltage to be supplied to the driving IC 14) based on a voltage across the points P and N boosted by the boost converter 59 (hereinafter also called a "boosted voltage" in some cases). In the first preferred embodiment, the voltage generator 15 and the capacitor 53 form a linear regulator circuit that generates the power source voltage based on the boosted voltage.

FIG. 2 shows the linear regulator circuit composed of the voltage generator 15 and the capacitor 53.

The voltage generator 15 includes a resistor 15a, a plurality of transistors 15b, a Zener diode 15c, a transistor 15d, a transistor 15e, and a resistor 15f. The point P, the resistor 15a, the transistors 15b, the Zener diode 15c, and the point N are connected in series in this order. The transistor 15d has a base terminal connected to a node between the resistor 15a and the transistor 15b at the top in the plane of the drawing, and a collector terminal connected to the point P. The transistor 15e is connected to the transistor 15d in a Darlington configuration. The resistor 15f is interposed between the emitter terminal of the transistor 15e and a ground potential.

The capacitor 53 is connected in parallel with the resistor 15f and the driving IC 14 between a point P1 (node between the transistor 15e and the resistor 15f) and a point N1 (ground potential).

Even if a voltage supplied across the points P and N fluctuates to some degree, the linear regulator circuit of the aforementioned structure outputs a fixed voltage lower than the voltage across the points P and N to the driving IC 14 interposed between the points P1 and N1. Referring to the example of FIG. 2, assuming that the voltage across the points P and N is from about 200 V to about 370 V, the linear regulator circuit generates a fixed voltage between the points P1 and N1, substantially same as a power source voltage supplied to the driving IC 14 (15 V, for example). In this structure, assuming that the driving IC 14 has an impedance of 3 kΩ, a total loss generated in the linear regulator circuit becomes about 3.3 W.

The linear regulator circuit releases heat generated by a difference between an input voltage input to the linear regulator circuit and an output voltage output from the linear regulator circuit. This makes it difficult to provide the semiconductor module 11 with a built-in linear regulator function, specifically the voltage generator 15, in light of a problem such as temperature increase. In contrast, the semiconductor module 11 of the first preferred embodiment is capable of suppressing temperature increase caused by the linear regulator function.

Figure 3:
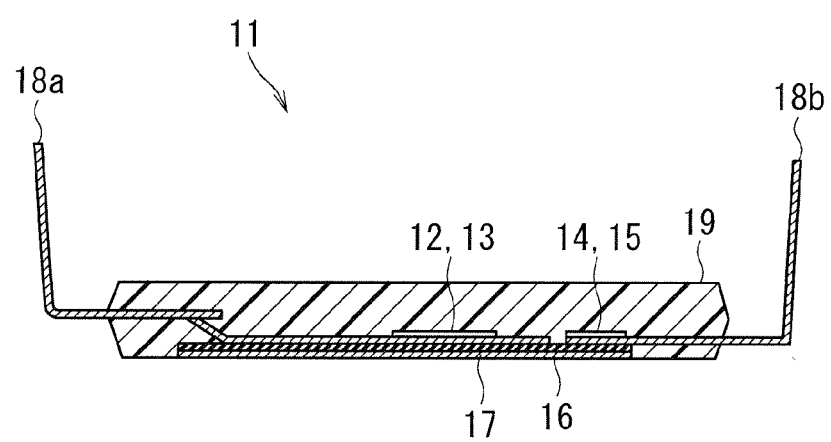
FIG. 3 is a sectional view showing the structure of the semiconductor module of the first preferred embodiment.

FIG. 3 is a sectional view showing the structure of the semiconductor module of the first preferred embodiment. The semiconductor module 11 includes a heat dissipating mechanism (insulating heat dissipating sheet 16 and heat sink 17), metal frames (first metal frame 18a and second metal frame 18b), and a resin mold 19, in addition to the diode 12, the semiconductor switching element 13, the driving IC 14, and the voltage generator 15 described above.

The insulating heat dissipating sheet 16 is formed on the heat sink 17 so as to contact the heat sink 17 tightly. The first and second metal frames 18a and 18b are formed on the insulating heat dissipating sheet 16 so as to contact the insulating heat dissipating sheet 16 tightly. The first and second metal frames 18a and 18b are composed of copper frames, for example. The diode 12 and the semiconductor switching element 13 are formed on the first metal frame 18a. The driving IC 14 and the voltage generator 15 are formed on the second metal frame 18b. To be specific, in the first preferred embodiment, the voltage generator 15 is mounted on the heat dissipating mechanism (insulating heat dissipating sheet 16 and heat sink 17).

The diode 12 and the semiconductor switching element 13, the driving IC 14 and the voltage generator 15, and the first and second metal frames 18a and 18b (package pins), are connected to each other appropriately via metal wires (not shown in the drawings) made of silver, aluminum and copper, for example. While not shown in the drawings, components such as the inductor 52 and the capacitors 53 and 55 are connected to the first and second metal frames 18a and 18b (package pins) outside the resin mold 19.

The resin mold 19 covers the components of the semiconductor module 11, except respective terminal portions of the first and second metal frames 18a and 18b and a surface of the heat sink 17 opposite a surface thereof on which the insulating heat dissipating sheet 16 is arranged. The resin mold 19 may be made of an epoxy resin, for example.

A semiconductor module without the aforementioned heat dissipating mechanism has a relatively high heat resistance. A temperature was estimated under operating condition of the linear regulator function of the voltage generator 15 while assuming a heat resistance to be 100° C./W, for example, and was found to increase to about 330° C. Such a semiconductor module suffers from a problem such as strict limitations on the temperature of environment where this semiconductor module is used, so that it cannot be provided with the voltage generator 15 therein.

In contrast, the semiconductor module 11 of the first preferred embodiment includes the aforementioned heat dissipating mechanism, allowing reduction of a heat resistance. A temperature was estimated under operating condition of the linear regulator function of the voltage generator 15 while assuming a heat resistance to be 3.5° C./W, for example, and was found to be about 11.6° C. Accordingly, it was found that the semiconductor module 11 can reduce temperature, compared to the semiconductor module without the aforementioned heat dissipating mechanism.

As described above, according to the semiconductor module 11 and the boost rectifier circuit 1 of the first preferred embodiment, the voltage generator 15 having the built-in linear regulator function is mounted on the heat dissipating mechanism. This can suppress temperature increase caused by the linear regulator function. Further, a power source voltage to drive the boost converter 59 is generated by using the linear regulator function based on a voltage boosted by the boost converter 59, thereby allowing reduction of power consumption (power to be supplied from outside).

Second Preferred Embodiment

FIG. 4 is a circuit diagram showing the structure of a semiconductor module and that of a boost rectifier circuit according to a second preferred embodiment of the present invention. Components of the semiconductor module and those of the boost rectifier circuit of the second preferred embodiment same as or similar to those described in the first preferred embodiment are identified by the same reference numbers, and differences from the first preferred embodiment are mainly described below.

FIG. 4 shows a specific circuit example of the driving IC 14, and a voltage supply 20 and a capacitor 56 are added in FIG. 4. While the capacitor 56 is described as being provided externally to the voltage supply 20, it may also be provided in the voltage supply 20.

The driving IC 14 shown in FIG. 4 includes a semiconductor switching element 14a and a semiconductor switching element 14b. The voltage supply 20 includes a diode 20a, a resistor 20b, a Zener diode 20c, and a semiconductor switching element 20d. The semiconductor switching element 14a is composed of a P-type MOSFET, and the semiconductor switching elements 14b and 20d are each composed of an N-type MOSFET.

The point P1, the semiconductor switching elements 14a and 14b, the diode 20a, and the point N1 are connected in series in this order. A node between the respective drain terminals of the semiconductor switching elements 14a and 14b is connected to the gate terminal of the semiconductor switching element 13. The respective gate terminals of the semiconductor switching elements 14a and 14b receive a PWM signal given from the PWM controller 54. The diode 20a has an anode connected to the source terminal of the semiconductor switching element 14b, and a cathode connected to the point N1.

The source terminal of the semiconductor switching element 14a, the resistor 20b, the capacitor 56, and the source terminal of the semiconductor switching element 14b are connected in series in this order. The Zener diode 20c has a cathode connected to a node between the resistor 20b and the capacitor 56, and an anode connected to the cathode of the diode 20a. The semiconductor switching element 20d has a gate terminal connected to the respective gate terminals of the semiconductor switching elements 14a and 14b, a drain terminal connected to the cathode of the Zener diode 20c, and a source terminal connected to the anode of the Zener diode 20c.

Figure 5:
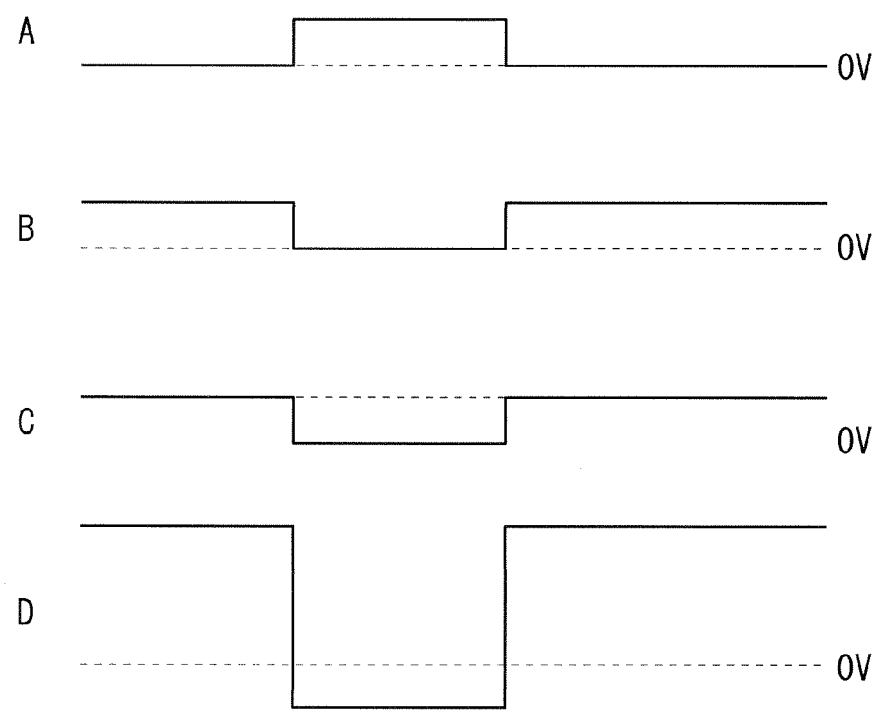
FIG. 5 is a timing chart showing the operation of the semiconductor module and that of the boost rectifier circuit of the second preferred embodiment.

FIG. 5 is a timing chart showing operations in the semiconductor module and the boost rectifier circuit of the aforementioned structures of the second preferred embodiment during switching between ON and OFF of the semiconductor switching element 13. Symbols A, B, C, and D of FIG. 5 correspond to points A, B, C, and D of FIG. 4 respectively.

A control signal (PWM signal from PWM controller 54) to turn ON or OFF the semiconductor switching element 13 is applied to the point A.

At the time of turn-on, a potential at the point A is switched from H to L. In response, the semiconductor switching element 14a becomes ON (active) whereas the semiconductor switching elements 14b and 20d become OFF (passive). Thus, a potential at the point D becomes the same as a power source voltage (15 V, for example) supplied from the voltage generator 15, thereby turning on the semiconductor switching element 13. Further, a current flows from the voltage generator 15 into the resistor 20b and the Zener diode 20c. In response, a potential at the point B is increased by a voltage VF (5 V, for example) of the Zener diode 20c, and electric charge corresponding to this voltage (5 V, for example) is stored in the capacitor 56.

At the time of turn-off, the potential at the point A is switched from L to H. In response, the semiconductor switching element 14a becomes OFF (passive) whereas the semiconductor switching elements 14b and 20d become ON (active). Thus, the potential at the point B becomes the same as a potential at the point N (here, 0 V) and the respective potentials at the points C and D also become substantially the same as the potential at the point N, thereby turning off the semiconductor switching element 13. Meanwhile, as a result of the function of a charge pump system using the voltage of the capacitor 56, the potential at the point C is reduced, compared to the potential at the point N, to a negative value by a voltage (5 V, for example) stored in the capacitor 56. The potential at the point D is also reduced by the same amount to a negative value for the same reason.

As described above, in the second preferred embodiment, the voltage supply 20 is capable of supplying a negative bias to the semiconductor switching element 13 during a non-transmission period (predetermined period) where the driving IC 14 does not transmit a power source voltage of the driving IC 14 to the semiconductor switching element 13.

This prevents a voltage applied to the gate terminal of the semiconductor switching element 13 from exceeding a threshold voltage, even if this gate terminal receives large noise and the like while the semiconductor switching element 13 is OFF. More specifically, noise tolerance of the semiconductor switching element 13 is enhanced to realize stable switching control.

This works effectively, especially if the semiconductor switching element 13 is composed of an element having a relatively low threshold voltage such as an MOSFET made of a wide band-gap semiconductor such as SiC or GaN.

Third Preferred Embodiment

Figure 6:
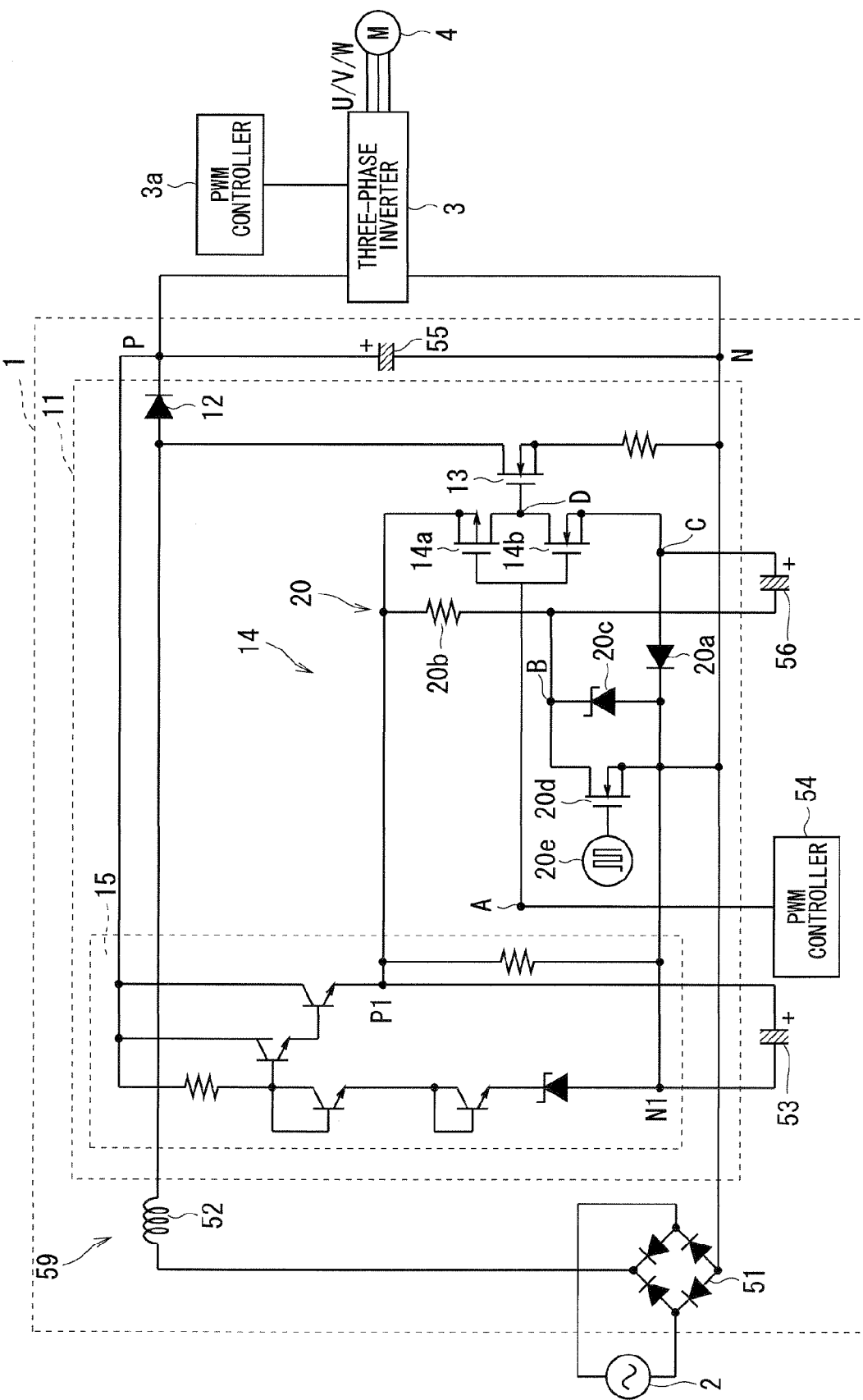
FIG. 6 is a circuit diagram showing the structure of a semiconductor module and that of a boost rectifier circuit according to a third preferred embodiment.

FIG. 6 is a circuit diagram showing the structure of a semiconductor module and that of a boost rectifier circuit according to a third preferred embodiment of the present invention. Components of the semiconductor module and those of the boost rectifier circuit of the third preferred embodiment same as or similar to those described in the second preferred embodiment are identified by the same reference numbers, and differences from the second preferred embodiment are mainly described below.

In the aforementioned second preferred embodiment (FIG. 4), the PWM signal is input to the gate terminal of the semiconductor switching element 20d, and timing of switching of the semiconductor switching element 13 to the non-transmission period (OFF period) is synchronous with timing of switching of the semiconductor switching element 20d to ON period.

In the third preferred embodiment, the voltage supply 20 additionally includes a signal oscillator 20e. The signal oscillator 20e is configured so as to input a square wave signal to the gate terminal of the semiconductor switching element 20d. This square wave signal makes the timing of switching of the semiconductor switching element 13 to OFF period (non-transmission period) asynchronous with the timing of the semiconductor switching element 20d to ON period.

FIG. 7 is a timing chart showing operations in the semiconductor module and the boost rectifier circuit of the aforementioned structures of the third preferred embodiment during switching between ON and OFF of the semiconductor switching element 13. Symbols A, B, C, and D of FIG. 7 correspond to points A, B, C, and D of FIG. 6 respectively.

In the third preferred embodiment, at time T1 before time T2 when a potential at the point A is switched from L to H, the signal oscillator 20e inputs a square wave signal switching from L to H to the semiconductor switching element. Further, at time T4 after time T3 when the potential at the point A is switched from H to L, the signal oscillator 20e inputs a square wave signal switching from H to L to the semiconductor switching element 20d. The operation of the semiconductor module and that of the boost rectifier circuit of the third preferred embodiment at each of the times T1 to T4 are described in detail next.

At the time T1, the potential at the point A is maintained L. Thus, the semiconductor switching elements 14a and 14b are maintained ON and OFF respectively. Meanwhile, the gate terminal of the semiconductor switching element 20d is switched from L to H, thereby switching the semiconductor switching element 20d from OFF to ON. This makes a potential at the point B become the same as a potential at the point N, and reduces a potential at the point C, compared to the potential at the point N, to a negative value by a voltage (5 V, for example) stored in the capacitor 56 as a result of the function of a charge pump system. Meanwhile, the semiconductor switching elements 14a and 14b are ON and OFF respectively. Thus, a potential at the point D is maintained not at the potential of the point C but at a power source voltage (15 V, for example) supplied from the voltage generator 15, so that the semiconductor switching element 13 is maintained ON.

At the time T2, the potential at the point A is switched from L to H. This switches the semiconductor switching elements 14a and 14b from ON to OFF and from OFF to ON respectively. Thus, the potential at the point D deviates from the aforementioned power source voltage and becomes the same as the potential at the point C, thereby turning OFF the semiconductor switching element 13.

At the time T3, the potential at the point A is switched from H to L. This switches the semiconductor switching elements 14a and 14b from OFF to ON and from ON to OFF respectively. Thus, the potential at the point D deviates from the potential at the point C and becomes the same as the aforementioned power source voltage, thereby turning on the semiconductor switching element 13.

At the time T4, the potential at the point A is maintained L, so that the semiconductor switching elements 14a and 14b are maintained ON and OFF respectively. Meanwhile, the gate terminal of the semiconductor switching element 20d is switched from H to L, thereby switching the semiconductor switching element 20d from ON to OFF. Then, a current flows from the voltage generator 15 into the resistor 20b and the Zener diode 20c. In response, the potential at the point B is increased by a voltage VF (5 V, for example) of the Zener diode 20c, and electric charge corresponding to this voltage (5 V, for example) is stored in the capacitor 56. At the same time, the potential at the point C becomes 0 V.

According to the semiconductor module 11 and the boost rectifier circuit 1 of the third preferred embodiment described above, a negative bias can be supplied to the semiconductor switching element 13 during a period between the times T1 and T4 longer than a non-transmission period between the times T2 and T3 where a power source voltage is not transmitted from the driving IC 14 to the semiconductor switching element 13. This makes it possible to supply a negative bias without delay in the non-transmission period between the times T2 and T3 (OFF period of the semiconductor switching element 13), realizing stable switching control reliably.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module, comprising
   a voltage generator capable of generating, by using a built-in linear regulator function, a power source voltage to drive a boost converter based on a voltage boosted by said boost converter,
   a driver that drives said boost converter,
   a heat dissipating mechanism on which said voltage generator is mounted,
   a semiconductor switching element being part of said boost converter, and
   a voltage supply capable of supplying a negative bias to said semiconductor switching element during a predetermined period including a non-transmission period where said driver does not transmit said power source voltage to said semiconductor switching element, wherein power from an output of said driver is provided to an input of said voltage generator, wherein said driver drives said semiconductor switching element by transmitting said power source voltage to said semiconductor switching element in response to a predetermined signal, and wherein said voltage supply comprises a diode, a resistor, a Zener diode and a semiconductor switching device between said driver and said voltage generator.

2. The semiconductor module according to claim 1, wherein said predetermined period is longer than said non-transmission period.

3. The semiconductor module according to claim 1, wherein said semiconductor switching element is made of a material including a wide band-gap semiconductor.

4. A boost rectifier circuit, comprising:
the semiconductor module as recited in claim 1;
an inductor being part of said boost converter; and
a rectifier circuit connected to said semiconductor module and said inductor.

5. The semiconductor module according to claim 1, wherein said voltage generator, said boost converter and said driver are mounted on said heat dissipating mechanism.

* * * * *